US005844176A

United States Patent [19]

Clark

[11] Patent Number: 5,844,176

[45] Date of Patent: Dec. 1, 1998

[54] SPEAKER ENCLOSURE HAVING PARALLEL PORTING CHANNELS FOR MID-RANGE AND BASS SPEAKERS

[76] Inventor: Steven Clark, 2005 Greens Blvd. Apt. B-401, Myrtle Beach, S.C. 29577

[21] Appl. No.: 715,831

[22] Filed: Sep. 19, 1996

[51] Int. Cl.[6] ........ H05K 5/00

[52] U.S. Cl. ........ 181/148; 181/153; 181/156; 181/196

[58] Field of Search ........ 181/144, 145, 181/148, 153, 155, 156, 196, 197, 199; 351/154, 155, 159

[56] References Cited

U.S. PATENT DOCUMENTS

| | | | |
|---|---|---|---|
| 1,741,274 | 12/1929 | Baumann | 181/31 |
| 2,491,982 | 12/1949 | Kincart | 181/31 |
| 2,792,069 | 5/1957 | Gately, Jr. | 181/145 |
| 2,822,884 | 2/1958 | Simpson | 181/31 |
| 2,866,513 | 12/1958 | White | 181/31 |
| 3,142,353 | 7/1964 | Todisco | 181/145 |
| 3,590,941 | 7/1971 | McKenzie | 181/145 |
| 3,666,041 | 5/1972 | Engelhardt | 181/145 |
| 3,712,411 | 1/1973 | Monroe | 181/31 B |
| 3,993,162 | 11/1976 | Juuti | 181/156 |
| 4,157,741 | 6/1979 | Goldwater | 181/159 |
| 4,286,688 | 9/1981 | O'Malley | 181/156 |
| 4,314,620 | 2/1982 | Gollehon | 181/144 |
| 4,349,084 | 9/1982 | Karpodines | 181/146 |
| 4,437,539 | 3/1984 | Festa | 181/145 |
| 4,512,434 | 4/1985 | Yoo | 181/146 |
| 4,524,845 | 6/1985 | Perrigo | 181/152 |
| 4,524,846 | 6/1985 | Whitby | 181/152 |
| 4,567,959 | 2/1986 | Prophit | 181/156 |
| 4,635,748 | 1/1987 | Paulson | 181/145 |
| 4,790,408 | 12/1988 | Adair | 181/152 |
| 4,805,729 | 2/1989 | Wascom | 181/144 |
| 4,807,293 | 2/1989 | Weckler | 381/159 |
| 4,819,761 | 4/1989 | Dick | 181/145 |
| 4,930,596 | 6/1990 | Saiki et al. | 181/152 |
| 4,942,939 | 7/1990 | Harrison | 181/156 |
| 4,953,655 | 9/1990 | Furukawa | 181/160 |
| 5,187,333 | 2/1993 | Adair | 181/152 |
| 5,296,656 | 3/1994 | Jung | 181/152 |
| 5,373,564 | 12/1994 | Spear et al. | 381/160 |
| 5,502,772 | 3/1996 | Felder | 381/188 |

*Primary Examiner*—Eddie C. Lee
*Attorney, Agent, or Firm*—Michael E. Mauney

[57] ABSTRACT

A speaker enclosure with at least one woofer and one mid-range speaker with associated parallel sound channels and ports for direction of the back waves generated by the speakers. The woofer and mid-range speaker are in a spaced relationship with the sound channel ports for the woofer speaker in close proximity to the mid-range speaker and the mid-range sound channel port in close proximity to the woofer speaker. The sound channels for the mid-range and woofer speakers are adjacent and parallel to each other. The back waves generated by the speakers travel along the sound channels which form a sound traveling path. The ports are located at a distance from the speakers generating the sound waves, but adjacent to other speakers, resulting in a life-like and rich sound.

7 Claims, 4 Drawing Sheets

SPEAKER ENCLOSURE HAVING PARALLEL PORTING CHANNELS FOR MID-RANGE AND BASS SPEAKERS

FIELD AND BACKGROUND OF THE INVENTION

1. Field of the Invention.

The present invention relates generally to a loudspeaker enclosure or cabinet and more particularly to loudspeakers cabinets of the type that have more than one speaker positioned therein. The present invention more fully utilizes existing sound emanating from the back of speaker cones to improve the overall sound reproduction qualities of the speakers as positioned and oriented in the present invention speaker cabinet 2. Background of the Invention.

Most audio loudspeakers are approximately cone shaped. The cone vibrates is response to an electrical signal, thus producing sound waves. Since the loudspeaker was invented, there have been efforts made to improve the quality of the sound produced by the speaker as perceived by the listener. One way of improving the quality of sound is to improve the quality of the electrical signal received by the speaker. Another way is to improve the quality of the sound generated by the speaker itself. The latter improvement relates mostly to the materials and the design of the speaker. Over a period of time speakers have become specialized. Speakers that produce high tones or sound waves of high frequency are designed differently and are of a different size than speakers that produce tones at a lower range which may be designed differently still from speakers that produce the lowest waves at or near the limits of human hearing perception. Nowadays the speakers are commonly divided into three categories: (1) tweeters, which produce the highest tones; (2) mid-ranges, which produce the middle tones; and (3) woofers, which produce the lowest tones. Typically, there is some overlap between the sound tones produced by speakers. That is, a woofer may produce sound frequencies at the upper end of the woofer frequency range, which overlaps sound waves produced by a mid-range speaker at the lower end of its frequency response range and so on.

Most stereo speaker designs use two or more speaker enclosures, with each enclosure having several speakers in each enclosure. Therefore, the quality of the sound perceived by a listener depends not only on the quality of sound produced by each speaker, but also by the complex way each speaker interacts with every other speaker. Additionally, a speaker cone will produce sounds and project it in two directions. Obviously, sound is projected outwardly from the base of the speaker cone, but because the speaker cone vibrates in two directions sound waves are also produced along the side walls and the apex of the speaker cone. These sound waves are usually referred to as back waves or rear waves. For sounds at lower frequency ranges, that is, sounds usually produced by woofers or by mid-range speakers at the low end of their frequency response, these rear waves are a particular problem. If the rear waves are out of phase with the front waves projected by the speaker, it may tend to cancel the front sound hence, muting or distorting the speaker sound. Additionally, the rear waves may interact with the speaker enclosure, which may cause a resonant effect or may even cause the speaker housing itself to vibrate producing sounds. The presence of these back waves and the interference they cause with the quality of sound reproduction from woofer and mid-range speakers has been a continuing problem in speaker design and, more specifically, in speaker enclosure design.

One way of dealing with the rear wave is to completely enclose the speakers in such a way that the rear wave is muted or muffled so that it does not cancel or otherwise interfere with the quality of the front wave produced by the speaker. This type of speaker is usually called an air suspension or infinite baffled speaker enclosure. But muting the rear wave "wastes" the rear wave sound reducing speaker efficiency.

Another way of dealing with the rear wave is to provide a sound channel and sound port so that the rear wave is projected outward, thus, it is hoped, augmenting the front wave produced by the speaker. This design can produce higher efficiency speakers, that is, speakers that produce a "bigger" sound, but require less speaker size and space than do speakers that lack a sound channel and porting of the rear wave. However, this porting produces problems of its own. The rear wave can be out of phase with the front wave which can result in muting or canceling of the front wave sound. Before reaching the port, the sound wave from the rear of the speaker encounters either the walls of the porting channel or of the speaker cabinet. The waves necessarily reflect off the walls. The reflected waves encounter waves directly created by the speaker cone which may be in phase or out of phase with each other. The sound channels for the ports or the speaker enclosure walls themselves may be caused to vibrate by the rear wave, creating new sound waves of different frequencies. The complex interactions of these rear waves with the speaker enclosure can result in resonance effects, standing waves, dead spots, and other sound phenomenon which can be impossible to predict in advance of the speaker enclosure construction. Therefore, it is exceedingly difficult to theoretically predict how a particular speaker enclosure design will function in the real world, that is, how it will be perceived by the listener. A speaker enclosure design that theoretically should produce good results frequently will in practice be found to give poor sound reproduction. The human ear and the perception of the listener is ultimately the standard by which the success of a speaker enclosure design is determined. Consequently, speaker enclosure design itself is as much an art as a science and proceeds as much by trial and error as by theoretical design and construction based on that design.

One example of a speaker enclosure design having a sound channel and sound port for dealing with the rear wave produced by a woofer is found in U.S. Pat. No. 5,373,564, Spear et al. This speaker transmission line leading to the port uses links equal to the quarterwave length of the lowest desired frequency produced by the speaker and uses angled 45° reflectors to produce a planer wave from the rear hemispherical wave emanating from the rear of the speaker. The transmission line is stuffed with a fibrous material to reduce resonances, to absorb high frequencies, and to allow low frequencies to pass.

A variation of a sound channel and porting design that attempts to use the rear wave from the woofer in a way that augments or improves the front wave is an acoustical labyrinth design. This design channels the rear wave from the woofer through a folded passageway long enough to slightly delay the sound as it emerges, which will then result in a reinforcement of the front wave at low frequencies. An example of a speaker using a folded sound tube of relatively long length is found in U.S. Pat. No. 3,993,162, Juuti. Here, the rear wave produced by the speaker is channeled in a tube of relatively long length and circular cross section. The tube is constructed so that phase inversion occurs, so that the sound emanating from the rear of the speaker matches the sound emanating from the front of the speaker. The tube construction is designed to minimize such problems as standing waves, resonances, and the like.

A speaker enclosure design that recognizes the interaction between mid-ranges, woofers and tweeters and attempts to use the back waves from the mid-range and woofers to enhance overall speaker enclosure sound reproduction efficiency is found in Festa U.S. Pat. No. 4,437,539. Here a base or woofer speaker is mounted to a central partition. The rear waves from the woofer are ported through a line somewhat L-shaped chamber. The front waves from the speaker pass into a central mid-range chamber which also has porting for the rear waves from the mid-range speakers. However, in this speaker design both the rear waves and the front waves produced by the bass or woofer speaker and the mid-range speaker are reflected at an approximate 45° angle before being projected outward into the listening area. It is recognized in this speaker design that the tweeter speakers, because of their high frequency tones, may be easily sealed and that the resulting front wave sound is basically unidirectional.

The Felder U.S. Pat. No. 5,502,772 recognizes that the rear wave, which is ordinarily 180° out of phase with the front sound pressure wave, can produce sound that interferes or otherwise adversely affects the quality of the sound produced by the front wave, which is the primary sound reproduction means for a speaker cone. The Felder invention utilizes numerous speakers, air baffles, and speaker baffles, and utilizes one speaker enclosure for both the left and right channels in a stereo output.

SUMMARY OF THE INVENTION

Consequently, it would be an advance in the art within one speaker enclosure to provide for use of the rear waves produced by woofer and mid-range speakers to provide higher speaker efficiencies and richness of sound while avoiding out-of-phase sound transmission, resonances, standing waves, dead spots, and other phenomenon which can muddy or impair the sound quality produced. In this invention, there is at least one woofer type speaker with the base of the speaker cone opening outward toward the listening area. Behind the woofer type speaker there is a sound channel leading to a sound port located in a spaced relationship from the woofer speaker cone. The sound channel is lined with appropriate material, such as fiber or other sound absorbing material, and has angles designed to avoid dead spots and to assure that the back wave sound ultimately emanating from the port will be redirected to align with the sound emanating from the mid-range speaker cone into the listening area. This speaker enclosure will have at least one mid-range speaker located in close proximity to the port for the back waves produced by the woofer speaker. The base of the speaker cone for the mid-range speaker opens outwardly toward the listening area. There is a sound channel to capture the back wave of the mid-range speaker. This sound channel is lined with fiber or other material having sound absorbing characteristics to reduce resonances, standing waves, and the like. This sound channel is angled to avoid dead spots and to assure that the back wave sound produced by the mid-range speaker cone is redirected to align with the front wave produced by the woofer speaker cone when the sound wave emerges from the speaker port for the mid-range sound channel. The port for the mid-range sound channel is located in close proximity to the speaker cone for the woofer, hence is in a spaced relationship to the mid-range speaker cone. The sound channels for the back wave, respectively for the woofer and mid-range, are aligned in an approximate parallel and adjacently spaced relationship so that the back waves produced respectively by the woofer and mid-range are traveling in opposite directions as they traverse the sound channel. It is believed that this arrangement of adjacent parallel aligned sound channels for the woofer and mid-range speakers respectively, tends to reduce resonance, vibrations in the speaker enclosure, and other interference which may detract from the quality of the sound reproduction of the speakers. It is also believed that porting the respective speakers at a distance from the speaker producing the back wave, but in proximity to another speaker having some overlap in the frequency response of the two speakers, results in a more life-like and rich sound than does conventional porting and sound channel arrangements.

DETAILED DESCRIPTION OF THE DRAWINGS

Figure 1:
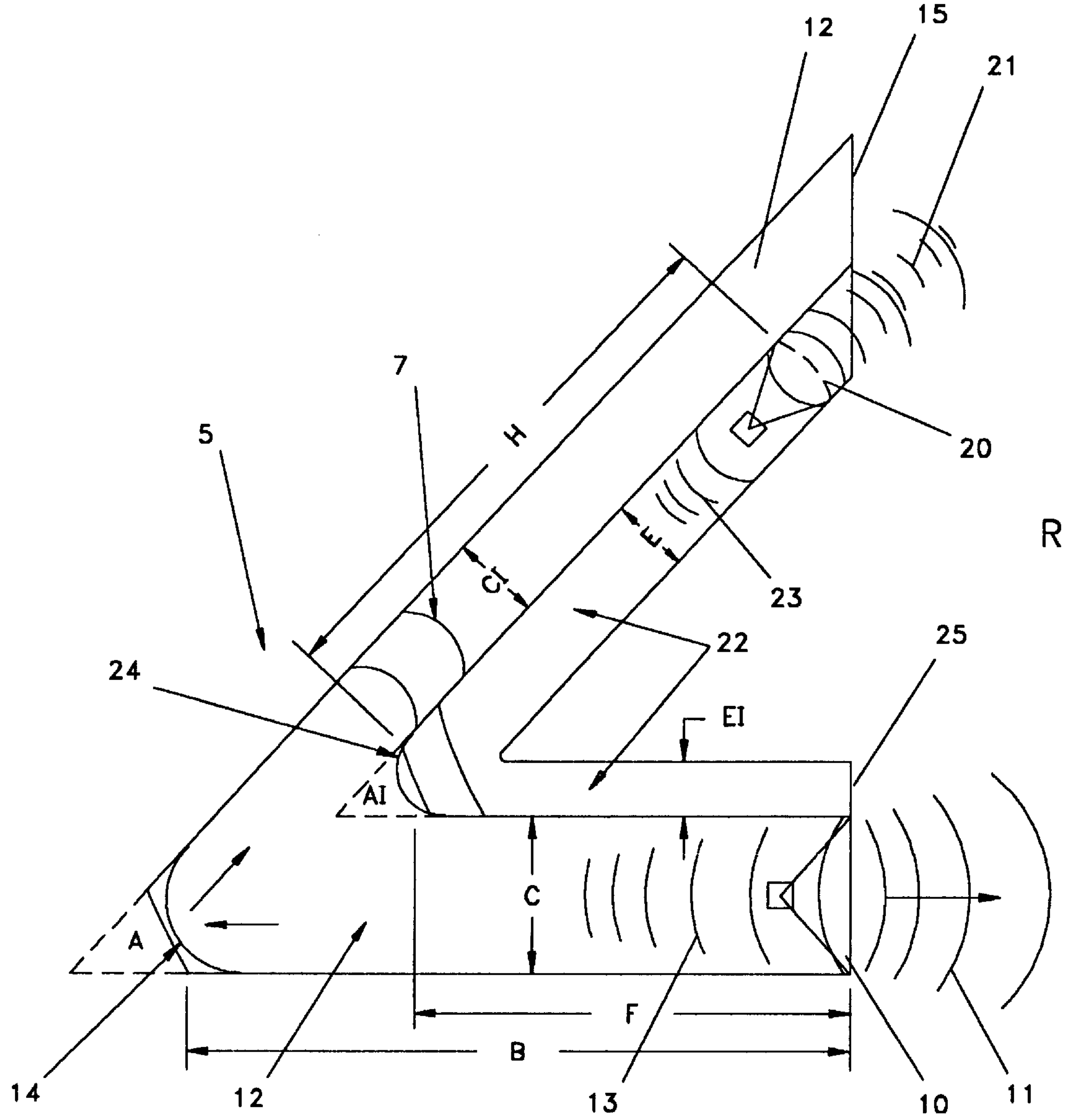
FIG. 1 is a schematic cut away side view of a speaker enclosure of the current invention with a woofer speaker with an associated back wave channel and port and a mid-range speaker with an associated back wave channel and port, showing structural relationships between the woofer speaker, channel, and port, and the mid-range speaker, channel, and port.

FIG. 1 shows a schematic arrangement of a speaker enclosure (5) consisting of a woofer speaker (10) its associated porting channel (12) and port (15) and a mid-range speaker (20) its associated porting channel (22) and port (25). It will be appreciated by one of ordinary skill in the art, that the angles, distances, and speaker sizes may be varied. A speaker enclosure design always involves trade-offs of speaker size, attractiveness of the design, weight of the speakers, cost of the design, and the like. If the designer plans to market a speaker that will retail for ten thousand dollars ($10,000.00) and can be ten (10) feet in height, five (5) feet in width, and five (5) feet in depth, then a huge variety of design options are available to that designer to produce a high quality sound reproduction. The challenge in speaker design is producing the best quality sound with the least expense in the smallest and most attractive speaker enclosure. In the present invention, the use of at least one woofer speaker (10) and one mid-range speaker (20) is required as are associated sound channels (12, 22) and ports (15, 25), with the sound channels (12, 22) for the woofer (10) and mid-range speaker (20) being approximately adjacent to each other, but with the rear sound waves respectively traveling in opposite directions from the woofer speaker and from the mid-range speaker. However, within these constraints the angles, distances, and speaker size may be varied, so that the surprisingly good sound reproduction qualities of this invention will still be present, given the inherent limitations of the various speaker sizes and speaker quality chosen for the enclosure.

The woofer speaker (10) is ordinarily the largest speaker in a speaker enclosure (although some designs may include a sub-woofer which can be larger still). A speaker is ordinarily designed as a cone. The speaker size, by ordinary usage, is the diameter of the base of the cone of the speaker. As shown in FIG. 1, the woofer speaker (10) will be oriented with the front sound waves (11) directed into the listening area (R). The rear waves are captured by the woofer porting channel (12) which is a cylindrical shape initially of the same diameter (C) as the speaker cone for the woofer speaker (10). This woofer porting channel (12) is lined with a fibrous sound-absorbing material throughout its entire length. The rear waves (13) are hemispherical in shape. Consequently, these waves expand and strike the side wall of the cylindrical woofer porting channel (12). At a distance (B) from the woofer speaker (10), the woofer porting channel (12) bends at an angle (A). The angle (A) is an acute angle. However, a curvelinear reflecting plate (14) is placed so that no dead spot develops in the corner of the woofer porting channel (12) at the point shown in dotted lines to define the angle (A) of the woofer porting channel as it changes direction. The curvelinear reflecting plate (14) should be an integral part of the porting channel (12) molded to appear as one piece. This results in a reflection of the back wave (7) toward listening area (R) and the woofer porting channel port (15). At the point the woofer porting channel (12) turns at the (A) angle, the diameter of the porting channel narrows to (C1). It has been found in practice, that the narrowing of a porting channel so that it is somewhat smaller than the diameter of the speaker cone for which the porting channel serves as an outlet for the back waves, tends to reduce resonances, standing waves, phase inversions, and other distortions of the sound when can adversely affect the quality of the sound reproduction as perceived by the listener.

The smaller one makes the angle (A) the closer the woofer porting channel port (15) is to the woofer speaker (10). It is ordinarily deemed important that the woofer porting channel port (15) be on approximately the same plane as the base of the speaker cone for the woofer speaker (10). A smaller angle (A) will reduce the distance between the woofer speaker (10) and the woofer porting channel port (15), hence, the smaller the overall speaker enclosure is required to be. However, it is believed that an angle substantially smaller than 45° will adversely affect the overall quality of the sound reproduction achieved by this speaker enclosure design. The reflecting plate (14) will not function as well when it is placed in a channel where the angle (A) is less than 45°. Likewise, the precise relationships between the diameter (C) of the woofer porting channel (12) before it bends at the angle (A), and the diameter (C1) of the woofer porting channel (12) after the bend at the angle (A) may vary somewhat without dramatically affecting the overall quality of the sound reproduction of the speaker enclosure design. However, experience has shown that the diameter (C1) should be approximately two-thirds of the diameter (C) to achieve good results.

Likewise, the distance (B) from the base of the woofer speaker cone (10) to the bend of the woofer porting channel (12) can vary within certain wide ranges. The smaller (B) is, the shallower the speaker is. However, the larger the (B) is the more planar like the rear waves are when they reach the curvilinear reflecting plate (14) of the woofer porting channel (12). It is believed that planar waves are more apt to reflect in a way that reduces loss of sound quality and minimizes production of standing waves, notes, resonance effects, and the like. Therefore, the larger one can make (B), the better likelihood one will get a high quality sound reproduction. Ordinarily, one would like to have an (B) that is at least twice as large as the diameter of the woofer speaker (10).

At close proximity to the port (15) for the rear waves (7) of the woofer speaker (10) is the mid-range speaker (20). It is oriented so that the plane of the base of the cone of speaker (20) is perpendicular to the walls of the narrowed portion of the woofer porting channel (12) for the woofer speaker (10). Thus, the front sound waves (21) from the mid-range speaker (20) project into the listening area (R) at an angle. As with the woofer speaker, the rear waves (23) produced by the mid-range speaker are captured by a mid-range porting channel (22). The initial diameter (E) of the mid-range porting channel (22) is the same as the diameter of the mid-range speaker cone (20). The mid-range porting channel (22) extends a distance (H) to an acute angle (A1) where the mid-range porting channel (22) bends so that it is aligned parallel with the initial part of the woofer porting channel (12) for the woofer speaker (10). Ordinarily, angles (A) and (A1) are the same. Again there is a curvelinear reflecting plate (24) placed to avoid a dead spot developing as the mid range porting channel (22) changes direction. The curvelinear reflecting plate (24) should be an integral part of the porting channel (22) molded to appear as one piece. The mid-range porting channel (22) terminates in the mid-range port (25) which is above and adjacent to the base of the cone of the woofer speaker (12).

As with the woofer porting channel (12) for the woofer speaker (10), the mid-range porting channel (22) for the mid-range speaker (20) ordinarily narrows from diameter (E) to diameter (E1) after porting channel (22) bends at angle (A1). It is believed that this enhances the sound reproduction qualities for the rear waves produced by the mid-range speaker (20) before they exit the speaker enclosure at port (25). As with the woofer porting channel, the ratio between the diameter (E) to the diameter (E1) is three to two. As mentioned above, it is a desirable feature to have the distance (B) as large as possible. It is also a desirable feature to have the overall speaker enclosure as small as possible. It is also a desirable feature to have the distance (H) and mid-range porting channel (22) for the mid-range speaker (20) to also be at least twice of the diameter of the mid-range speaker (20). Ordinarily, mid-range speakers are significantly smaller than are woofer speakers, which reflects their use in producing higher tone, hence the cone size need not be as large in a mid-range speaker as in a woofer speaker. Therefore, it is ordinarily advisable to place the mid-range porting channel (22) for the mid-range speaker (22) respectively above the base of the woofer porting channel (12) and proximal to the woofer porting channel (12) for the woofer speaker (10) as is shown in FIG. 1. This results in a compact speaker enclosure, while utilizing the structural features necessary to achieve the sound quality in this invention. However, this arrangement is a matter of design convenience and not a matter of functional necessity in this design. The mid-range porting channel (22) for the mid-range speaker (20) could be side by side with the porting channel (12) for the woofer speaker (10) or, indeed, relationships could be reversed where the mid-range porting channel (22) was distal to the woofer porting channel (12).

Figure 2:
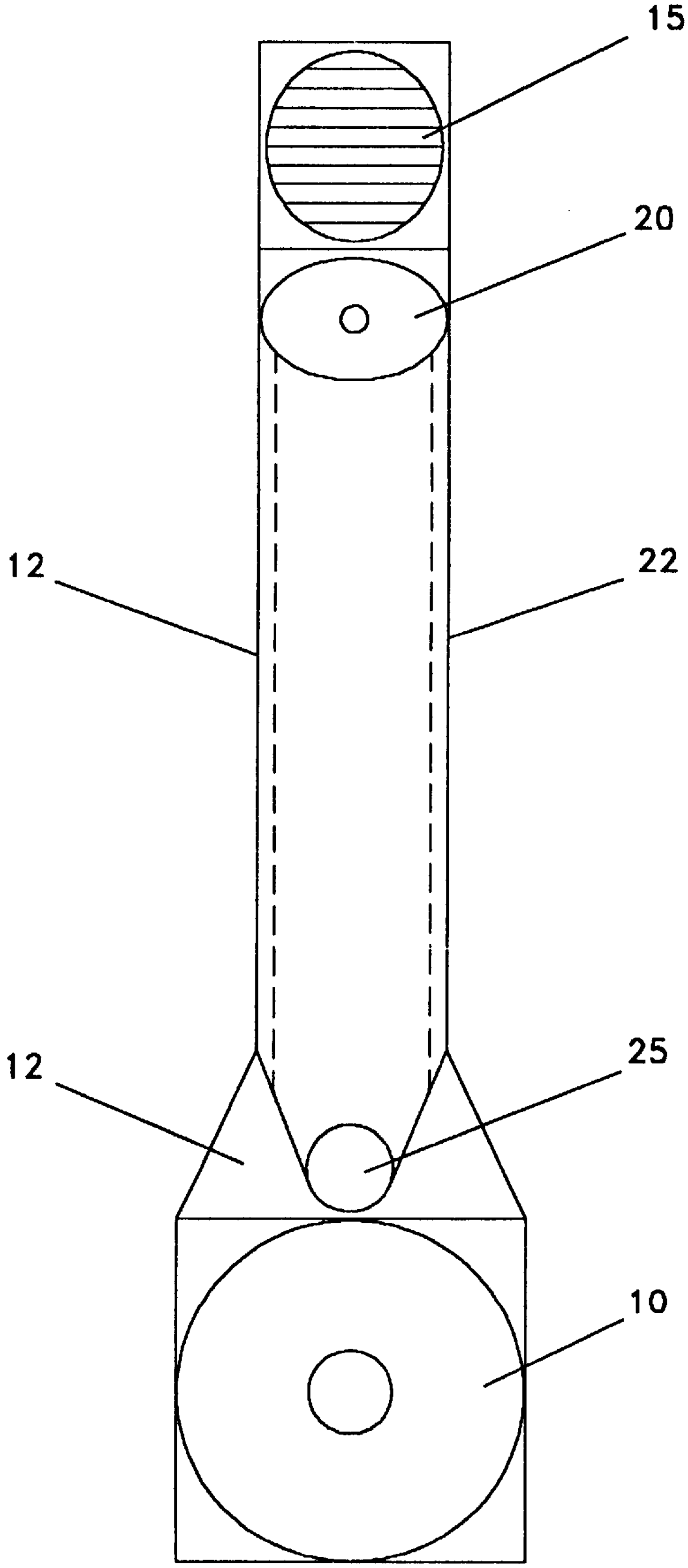
FIG. 2 is a schematic front view of the speaker enclosure shown in FIG. 1.

FIG. 2 shows a mid-range speaker and a woofer speaker enclosure of FIG. 1 from the front perspective. The woofer sound channel port (15) is usually mounted above the mid-range speaker (20). The mid-range speaker (20) is seen as oblong because it is at an oblique angle from the perspective of the viewer who would be facing the speaker in the listening area (R). The woofer speaker (10) would ordinarily be mounted at the base of the speaker enclosure. Its speaker cone is directly aimed into the listening area (R) hence, is seen by the viewer as a circle. Because woofer speakers ordinarily are substantially larger than mid-range speakers, the narrowed portion (C1) of the woofer rear wave channel (12) will often be as large or larger than the diameter of the mid-range speaker (20) and the initial portion of the mid-range speaker channel (22). When the mid-range speaker channel (22) bends at the acute angle (A1), then it narrows to diameter (C1) as is shown at the mid-range port (25). The mid-range channel (22) for the mid-range speaker (20) is shown in dotted line. The mid-range speaker channel (22) would ordinarily be in front of and perhaps somewhat smaller than the woofer speaker channel (12) for the woofer speaker (10). The entire speaker arrangement could be enclosed in a conventional box-like arrangement or the channels themselves could be structural and could be exposed to the listener, which would result in a more modern appearance for the speakers. A tweeter or several tweeter speakers could be enclosed and mounted immediately below the mid-range speaker (20) or above the port (15) for the rear waves of the woofer speaker (10). A tweeter speaker is ordinarily enclosed in an acoustic suspension box. The high frequency of the sounds produced by the tweeter speakers do not ordinarily cause the same resonances, standing waves, and out-of-phase effects that may be created by the lower, more energetic tones produced at the low end of the mid-range speakers and by woofer or sub-woofer speakers. Therefore, a tweeter or multiple tweeters may be mounted in any convenient place without it adversely affecting the overall quality of the sound reproduction afforded by the present speaker enclosure invention.

Figure 3:
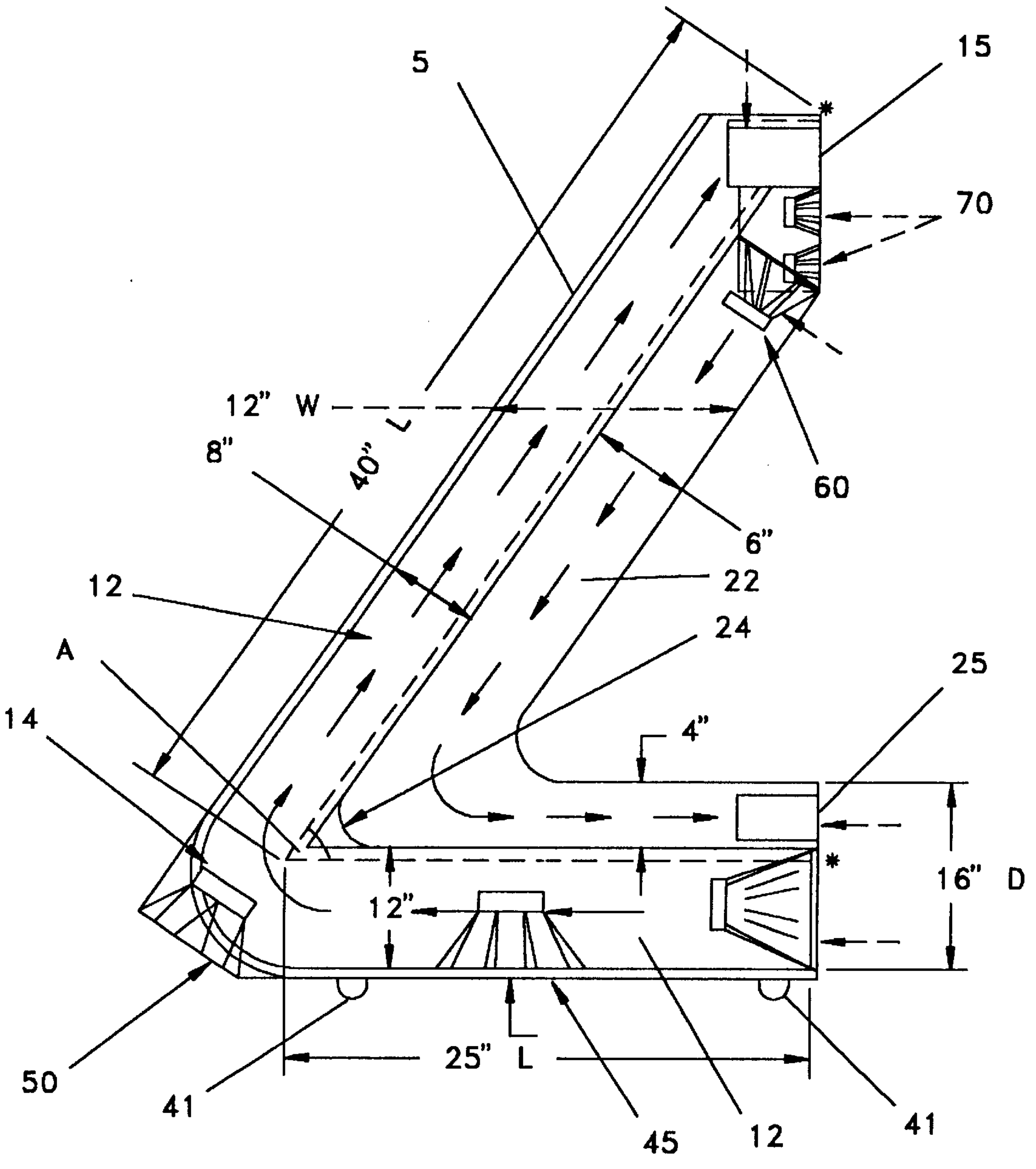
FIG. 3 is a cut away side view of one possible type of commercial embodiment of the speaker enclosure.
Figure 4:
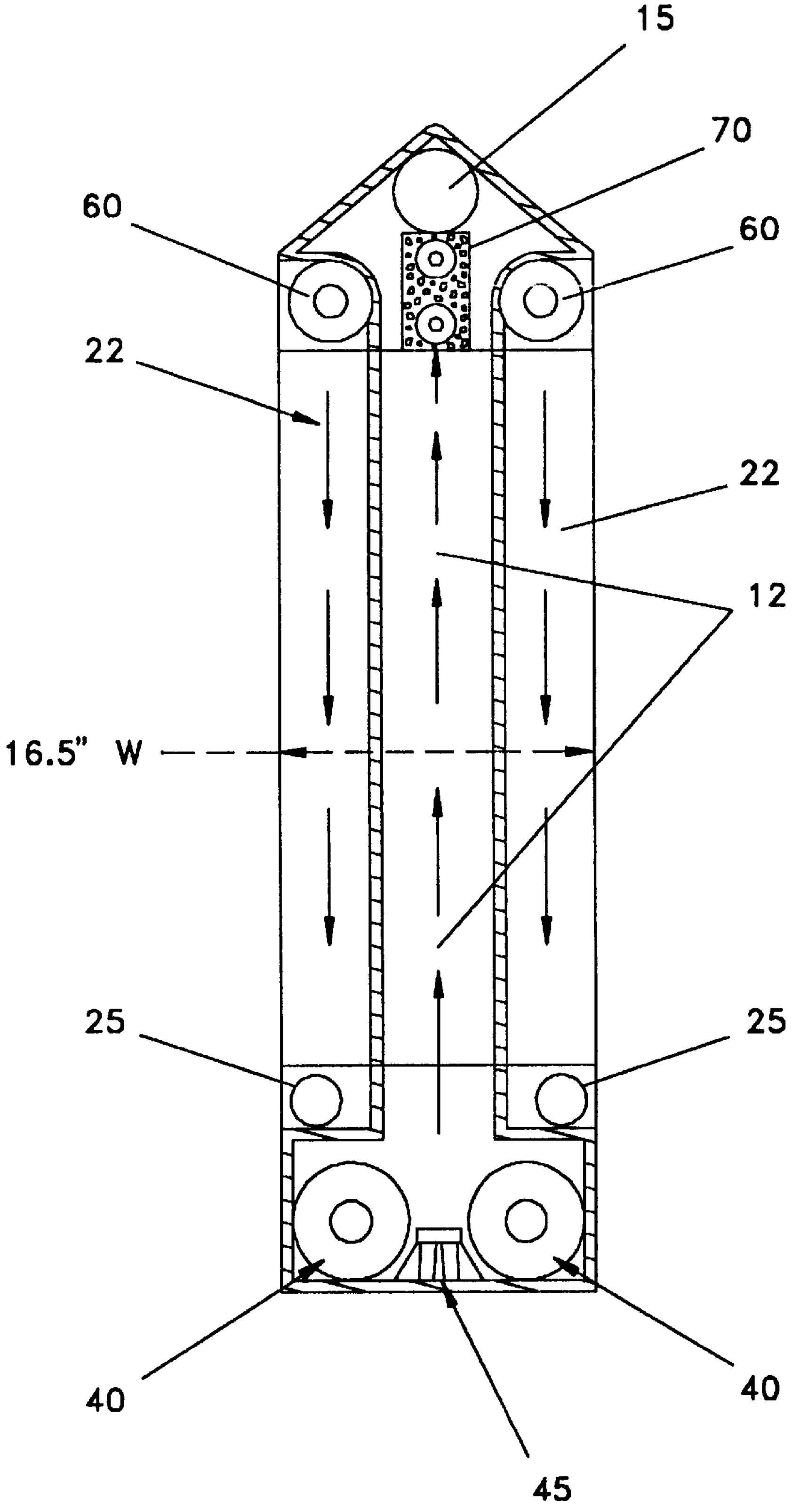
FIG. 4 is a front view of the commercial embodiment of the speaker enclosure shown in FIG. 3.

FIGS. 3 and 4 show how this invention may be employed in a commercial embodiment of this speaker enclosure design. Ordinarily, speaker enclosures are sold in pairs so that they may be located apart from each other for appropriate stereo sound effects. Pairs of speakers sell anywhere from $20.00 or $30.00 for a pair to thousands of dollars for a pair. The purpose of FIGS. 3 and 4 is to show how this speaker enclosure invention can be employed in a typical speaker design that would retail in the mid-range of cost for a pair of speaker enclosures. FIG. 4 shows how woofer speakers might be placed in the current invention design. There are two 12-inch woofer speakers (40) projecting into the speaker area. The speaker enclosure does not rest on the woofer porting channels (12), but rather on small legs (41) that raise the speaker enclosure (5) slightly off the floor. Placed within the woofer porting channel (12) is a passive radiator 15-inch sub woofer speaker (45) which projects downward toward the floor on which the speaker enclosure would rest. The legs (41) are required when a downwardly pointing sub-woofer is used. At the point the woofer porting channel (12) bends, an additional woofer speaker (50) could be placed. This would be aimed at an angle toward the floor and away from the listening area (R). This additional woofer speaker (50) would ordinarily be oriented so that the rear sound waves from this third woofer (50) would be aimed directly down the narrowed portion of the woofer speaker channel (12). The initial distance (I) should be at least 25 inches or slightly more than twice the diameter of the twin woofer speakers (40).

There are twin 6-inch mid-range speakers (60) placed above the woofer speakers (40) and in close proximity to the woofer channel port (15). The mid-range speaker channels (22) are parallel to and proximal to the woofer speaker channel (12). This relationship can be seen clearly in FIGS. 3 and 4. The back waves generated by the woofer speakers (40, 45, and 50) travel up the fibrous lined woofer speaker channel (12) to the woofer channel port (15). The direction of the travel of these back waves is shown in FIGS. 3 and 4 by the arrows starting at the two 12-inch woofer speakers (40). The mid-range speaker channels (22) terminate in the ports (25) which are located above and in proximity to the woofer speakers (40). FIGS. 3 and 4 show where two 1-inch tweeters (70) in an acoustic suspension or otherwise fiber baffled enclosure. This tweeter enclosure could be mounted beside the mid-range speakers (60) and below the woofer speaker channel port (15). Two tweeter speakers (70) are placed near the mid-range speaker (60) in a fiber filled enclosure. The back waves from the tweeters are negligible in this speaker design.

Because the woofer speakers are 12 inches in diameter, the woofer channels must also be 12 inches in diameter initially. Because there are two woofer speakers in one channel, the channel can be somewhat oblong shaped. Once the channel has approached the point of the bend where the woofer speaker (50) is located, the channel narrows to approximately 8 inches and proceeds to the point of the woofer speaker channel port (15). The mid-range speakers arc 6 inches so the mid-range speaker channel (22) is initially 6 inches. After it passes the point where it bends back to the mid-range speaker channel port (25), this channel narrows to 4 inches. This preserves the approximate three to two ratio which has been found to give good results. These channels are lined with a fibrous sound absorbing material to reduce resonances, standing waves, and other undesirable phenomenon. The woofer speaker channel ports (15) are located in close proximity to the mid-range speakers (60). Likewise, the mid-range speaker channel ports (25) are in proximity to the outwardly pointing woofer speakers (40). Distance (L) from the face of the woofer speaker (40) to the point the woofer speaker channel (12) bends should be at least 25 inches. The angle of the bend (A) is the same both for the woofer speaker channel and the mid-range speaker channel and should be no less than 45°. However, it will be appreciated by one of skill in the art that many variations are possible within the framework provided by the requirements of this invention for parallel porting channels traveling in opposite directions with ports for the woofer placed in proximity to the mid-range speakers and ports for the mid-range speakers placed in proximity to the woofer speakers.

What is claimed is:

1. A loud speaker enclosure combination comprising:

(a) at least one woofer type speaker;

(b) at least one mid-range type speaker;

(c) a woofer sound channel that has a first portion whose walls begin at and are perpendicular to a face of said woofer type speaker and extends rearwards from said face of said woofer type speaker to an angled reflecting plate portion of said woofer sound channel which lead to and then narrows to a second smaller portion of said woofer sound channel that terminates at a woofer sound channel port;

(d) a mid-range sound channel that has a first portion whose walls begin at and are perpendicular to a face of said mid-range type speaker and extends rearwards from said face of said mid-range type speaker to an angled reflecting plate portion of said mid-range sound channel which leads to and then narrows to a second smaller portion of said mid-range sound channel that terminates at a mid-range sound channel port, said mid-range sound channel adjacent and parallel to said woofer sound channel.

2. A loud speaker enclosure combination as set forth in claim 1 wherein said woofer sound channel's first portion length is at least twice said woofer type speaker's diameter and said mid-range sound channel's first portion is at least twice said mid-range type speaker's diameter.

3. A loud speaker enclosure combination as set forth in claim 2 wherein said mid-range type speaker and said woofer type speaker define a vertical plane.

4. A loud speaker enclosure combination as set forth in claim 3 wherein said woofer sound channel's angled reflecting plate portion is at an angle of at least 45° and said mid-range sound channel's angled reflecting plate portion is at an angle of at least 45°.

5. A loud speaker enclosure combination as set forth in claim 4 wherein said woofer sound channel's angled reflecting plate portion is a curvilinear shape and said mid-range sound channel's angled reflecting plate portion is a curvilinear shape.

6. A loud speaker enclosure combination as set forth in claim 5 wherein said woofer sound channel's second smaller portion's cross-sectional area is two third's of a cross-sectional area of the woofer sound channel's first portion and said mid-range sound channel's second smaller portion's cross-sectional area is two third's of a cross-sectional area of the mid-range sound channel's first portion.

7. A loud speaker enclosure combination as set forth in claim 6 wherein said woofer sound channel and said mid-range sound channel are lined with sound absorbing material.

* * * * *